(12) United States Patent
Frolov

(10) Patent No.: US 12,271,544 B2
(45) Date of Patent: Apr. 8, 2025

(54) METHOD AND DEVICE FOR MEASURING A FORCE ACTION

(71) Applicant: Continental Automotive Technologies GmbH, Hannover (DE)

(72) Inventor: Vitalis Frolov, Aschaffenburg (DE)

(73) Assignee: Continental Automotive Technologies GmbH, Hannover (DE)

( * ) Notice: Subject to any disclaimer, the term of this patent is extended or adjusted under 35 U.S.C. 154(b) by 0 days.

(21) Appl. No.: 18/529,474

(22) Filed: Dec. 5, 2023

(65) Prior Publication Data

US 2024/0201807 A1    Jun. 20, 2024

(30) Foreign Application Priority Data

Dec. 15, 2022 (DE) ...................... 10 2022 213 724.8

(51) Int. Cl.
*G06F 3/041* (2006.01)
*G01L 1/16* (2006.01)

(52) U.S. Cl.
CPC ................ *G06F 3/041* (2013.01); *G01L 1/16* (2013.01); *G06F 2203/04105* (2013.01)

(58) Field of Classification Search
CPC ... G06F 3/041; G06F 2203/04105; G01L 1/16
See application file for complete search history.

(56) References Cited

U.S. PATENT DOCUMENTS

| | | |
|---|---|---|
| 4,760,345 A | 7/1988 | Buesser et al. |
| 2010/0107772 A1* | 5/2010 | Takizawa ................ G01L 9/008 |
| | | 73/723 |
| 2015/0123931 A1 | 5/2015 | Kitchens et al. |
| 2015/0226692 A1 | 8/2015 | Dastgheib et al. |
| 2022/0236824 A1 | 7/2022 | Takahashi et al. |

FOREIGN PATENT DOCUMENTS

| | | | |
|---|---|---|---|
| CN | 108375431 A | * 8/2018 | ............... G01L 1/16 |
| DE | 102013222759 A1 | 5/2015 | |
| EP | 0253016 A1 | 1/1988 | |
| EP | 0325903 A2 | 8/1989 | |
| GB | 2122746 A | 1/1984 | |
| JP | 2001115886 A | 4/2001 | |
| JP | 2022113275 A | * 8/2022 | |

OTHER PUBLICATIONS

English translation of JP-2022113275-A (Year: 2022).*
English translation of CN-108375431-A (Year: 2018).*
Search Report dated Oct. 6, 2023 from corresponding German patent application No. 10 2022 213 724.8.
"Piezo Film Sensors" (Technical Manual), REV Apr. 2, 1999, Measurement Specialists, Inc., Norristown, PA, 89 pages.
Extended European Search Report mailed May 8, 2024 from corresponding European patent application No. 23209614.9.

* cited by examiner

*Primary Examiner* — Lixi C Simpson

(57) ABSTRACT

The present disclosure relates to a method and a device for measuring a force action. The disclosure additionally relates to an input apparatus which uses such a device or such a method. In a first step, a voltage pulse resulting from a force action on a force sensor is generated by a charge amplifier. Using this voltage pulse, a trigger pulse may be generated by a comparator circuit. A voltage value derived from the voltage pulse is then stored in a storage capacitor by a current mirror. The capacitor voltage resulting therefrom may be evaluated by an evaluation unit.

8 Claims, 6 Drawing Sheets

METHOD AND DEVICE FOR MEASURING A FORCE ACTION

CROSS REFERENCE TO RELATED APPLICATION

This U.S. patent application claims the benefit of German patent application No. 10 2022 213 724.8, filed Dec. 15, 2022, which is hereby incorporated by reference.

TECHNICAL FIELD

The present disclosure relates to a method and a device for measuring a force action. The disclosure additionally relates to an input apparatus which uses such a device or such a method.

BACKGROUND

In order to realize input apparatuses with active haptic feedback, determining the actuation force during the actuation process is advantageous and often required as well. An actuation process is always dynamic and usually consists of the phases of touching, pressing (in the case of buttons), pausing (in the case of sliding controllers), reducing pressure and releasing.

For force measurement purposes, various methods, based e.g. on a displacement measurement or a strain measurement, and sensors are already realized and in use. Examples of the sensors that may be mentioned include optical, acoustic, capacitive, inductive, piezoresistive, piezoelectric or strain-gauge-based sensors.

The conventional methods and sensors often do not satisfy the requirements of manufacturers in the automotive sector, and so they are not usable, or are usable only to a limited extent, in this sphere. The requirements here concern for example sensitivity, required installation space, price, scalability, speed, and insensitivity vis-à-vis mechanical disturbing influences and manufacturing tolerances. The normally very cost-intensive mechanical and electronic concept, in particular, is problematic.

Sensing of a force action which manages almost without a mechanical deformation may be effected by a piezoelectric sensor. Piezoelectric sensors are based on the principle of electrical charge transfer in conjunction with mechanical deformation. They have a very high internal resistance. The measurement of the quantity of charge poses a certain challenge depending on the requirement, since a measuring arrangement generally brings about charge balancing. Moreover, the measurement variable of the piezoelectric sensor changes very rapidly, and so the evaluation has to be effected using high-precision electronics.

Piezoelectric sensors are often interconnected with integrated charge amplifiers. A force action on the piezoelement results in the generation of a quantity of electrical charge proportional to the force. This quantity of charge is converted into a voltage by an integrator circuit. The analog electronics ideally yield a static value proportional to the strain as output value.

Against this background, EP 0 253 016 A1 describes a charge amplifier circuit, e.g. for a piezoelectric measuring transducer. The charge amplifier circuit comprises an operational amplifier with an integrating capacitor between its inverting input and its output, and also a resetting device with a switch that is closed in the resetting phase for discharging the integrating capacitor.

The integrated charge amplifiers generally yield very short pulses that decrease with an exponential function. The evaluation of these pulses is very complex and prone to inaccuracies. Moreover, the evaluation requires high sampling rates.

SUMMARY

It is an object of the present disclosure to provide improved solutions for measuring a force action.

This object is achieved by a method having the features of the claims, by a device having the features of the claims, and also by an input apparatus having the features of the claims. The dependent claims relate to preferred configurations of the disclosure.

In accordance with a first aspect of the disclosure, a method for measuring a force action comprises generating a voltage pulse resulting from a force action on a force sensor by a charge amplifier, and storing a voltage value derived from the voltage pulse in a storage capacitor by a current mirror.

In accordance with a further aspect of the disclosure, a device for measuring a force action comprises a charge amplifier for generating a voltage pulse resulting from a force action on a force sensor, and a current mirror for storing a voltage value derived from the voltage pulse in a storage capacitor.

In the case of the solution according to the disclosure, the voltage level of the output of the integrator or of the charge amplifier is stored in a capacitor with the aid of a current mirror, with the result that the charge cannot flow away. This enables a longer evaluation time and keeps the signal level constant over a longer period of time. In this case, the voltage value produced is inversely proportional to the force action. The effects of a possible signal shift are reduced by the current mirror. In addition, the transistors of the current mirror may be configured in temperature-compensated fashion, such that temperature influences on the measurement are reduced. The resulting voltage value of the capacitor may be detected and evaluated by an evaluation unit, e.g. by a microcontroller via the ADC input thereof (ADC: Analog-to-Digital Converter). In this case, both an actuation and a load relief of the force sensor may be evaluated.

In accordance with one aspect of the disclosure, storing the output voltage in the storage capacitor is triggered by a trigger pulse of a comparator circuit. In the case of an actuation of the force sensor, the level then decreases inversely proportionally to the force. In the case of a load relief, the level returns again to the initial state.

In accordance with one aspect of the disclosure, the comparator circuit comprises two comparators, which make possible storing a positive and a negative voltage value derived from the voltage pulse. This allows a positive and a negative pulse to be stored alternately. In the event of a renewed trigger pulse, the capacitor is thus subjected to charge reversal. In this case, actuation and load relief of the force sensor each have a dedicated voltage value that is inversely proportional to the force action.

In accordance with one aspect of the disclosure, the force sensor is a piezoelectric sensor or an electrodynamic sensor. A piezoelectric sensor allows the detection of a force action virtually without a mechanical deformation, which is advantageous particularly for applications in the automotive sector. Alternatively, electrodynamic sensors may also be used instead of a piezoelectric sensor.

A solution according to the disclosure is preferably used in a machine, e.g. in a means of transport, an industrial machine or a domestic appliance. The means of transport may be for example a motor vehicle, an aircraft, a rail vehicle, or a watercraft.

BRIEF DESCRIPTION OF THE DRAWINGS

Further features of the present disclosure will become apparent from the following description and the appended claims in conjunction with the figures, wherein:

DETAILED DESCRIPTION

For a better understanding of the principles of the present disclosure, embodiments of the disclosure will be explained in greater detail below with reference to the figures. The same reference signs are used for identical or functionally identical elements in the figures and are not necessarily described again for each figure. It goes without saying that the disclosure is not restricted to the embodiments illustrated and that the features described may also be combined or modified without departing from the scope of protection of the disclosure as defined in the appended claims.

Figure 1:
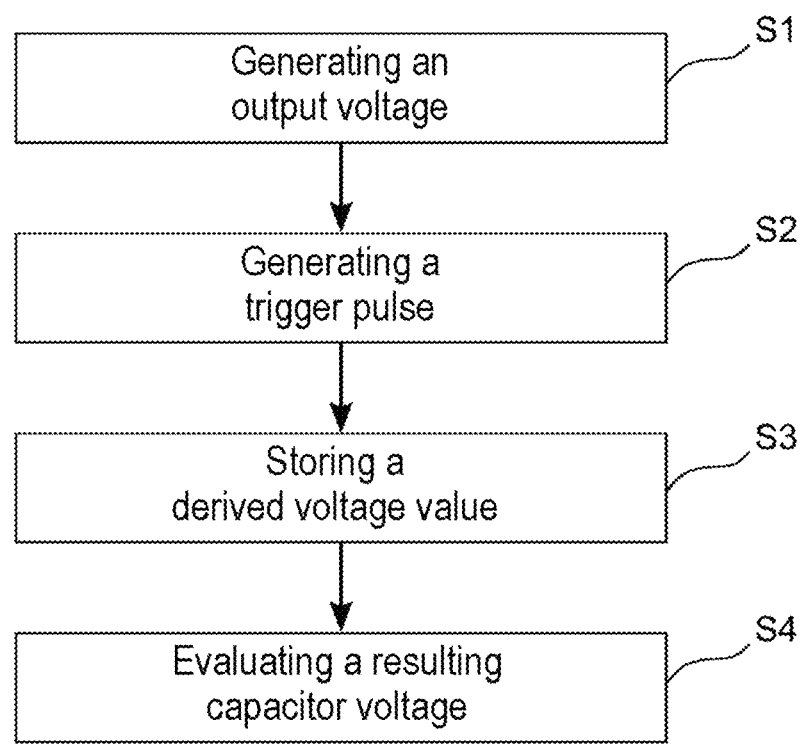
FIG. 1 schematically shows a method for measuring a force action.

FIG. 1 schematically shows a method for measuring a force action. In a first step, a voltage pulse resulting from a force action on a force sensor is generated 51 by a charge amplifier, e.g. on account of an actuation of an operator interface. The force sensor may be e.g. a piezoelectric sensor or an electrodynamic sensor. Using this voltage pulse, a trigger pulse may be generated S2 by a comparator circuit. A voltage value derived from the voltage pulse is then stored S3 in a storage capacitor by a current mirror. The capacitor voltage resulting therefrom may be evaluated S4 by an evaluation unit in order to determine a user input, for example. Alternatively, the comparator circuit may also comprise two comparators, which make possible storing S3 a positive and a negative voltage value derived from the voltage pulse.

Figure 2:
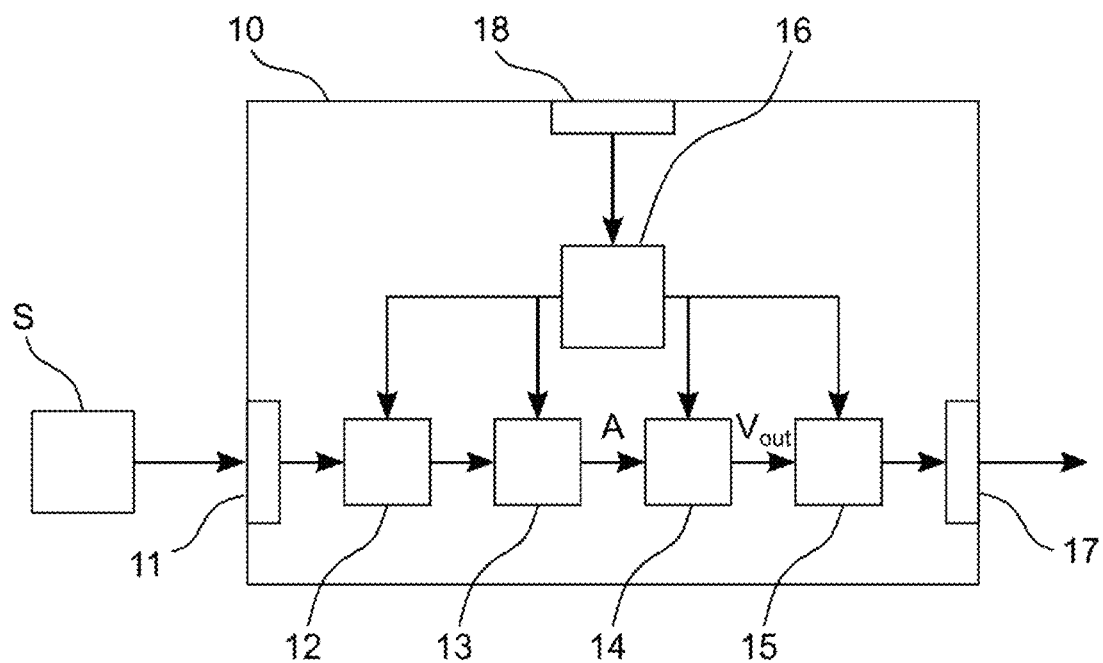
FIG. 2 schematically shows a device for measuring a force action.

FIG. 2 shows a simplified schematic illustration of a device 10 for measuring a force action. The device 10 has an input 11, to which a force sensor S is connected. Alternatively, the force sensor S may also be part of the device 10. The force sensor S may be e.g. a piezoelectric sensor or an electrodynamic sensor. A charge amplifier 12 is configured to generate a voltage pulse resulting from a force action on the force sensor S. A comparator circuit 13 is configured to generate a trigger pulse A using this voltage pulse. A current mirror 14 is configured to store a voltage value derived from the voltage pulse in a storage capacitor. An evaluation unit 15 may be provided, which is configured to evaluate a resulting capacitor voltage $V_{out}$ in order to determine a user input, for example. Information concerning the user input determined may then be output via an output 17 of the device 10. Alternatively, the comparator circuit 13 may also comprise two comparators, which make possible storing a positive and a negative voltage value derived from the voltage pulse. The charge amplifier 12, the comparator circuit 13, the current mirror 14 and the evaluation unit 15 can optionally be controlled by a control module 16. Moreover, an interface 18 may be provided, via which settings of the charge amplifier 12, of the comparator circuit 13, of the current mirror 14, of the evaluation unit 15 or of the control module 16 can be changed.

Figure 3:
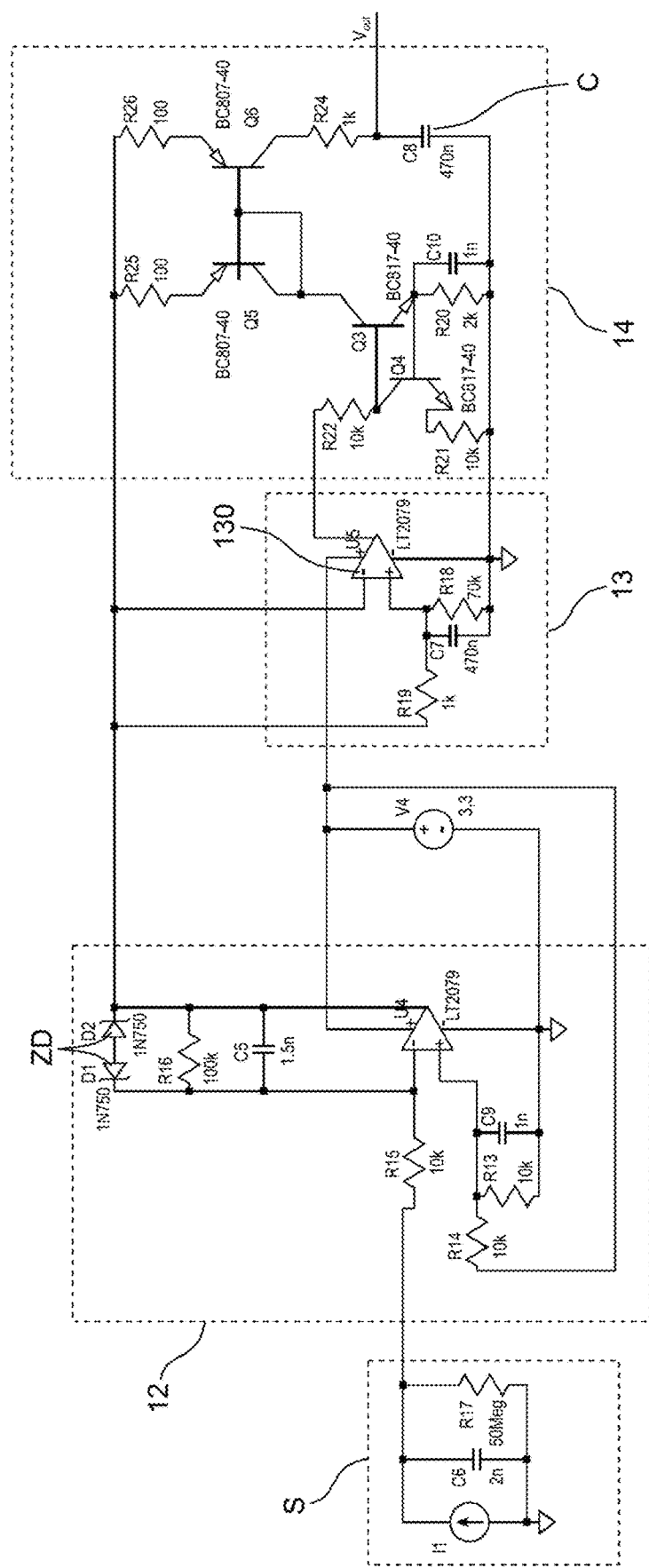
FIG. 3 shows a first circuit that implements a solution according to the disclosure.

FIG. 3 shows by way of example a first circuit that implements a solution according to the disclosure. In this case, a known integrator circuit for evaluating piezoelectric sensors is extended by a comparator circuit 13 and a current mirror 14. The individual electronic components of the circuit will not be discussed at this juncture. They are designated in the figure and known to a person skilled in the art. The quantity of electrical charge generated by a force sensor S, here a piezoelectric sensor, on account of an actuation is converted into a voltage pulse by a charge amplifier 12, here an integrator circuit. The voltage level of the output of the integrator or of the charge amplifier 12 is stored in a capacitor C with the aid of the current mirror 14, with the result that the charge cannot flow away. In this case, the capacitor voltage $V_{out}$ is limited by Zener diodes ZD to a predefined value, e.g. to 2 V. The storage is triggered by trigger pulses of the comparator circuit 13. The comparator circuit 13 illustrated in FIG. 3 comprises a single comparator 130.

Figure 4:
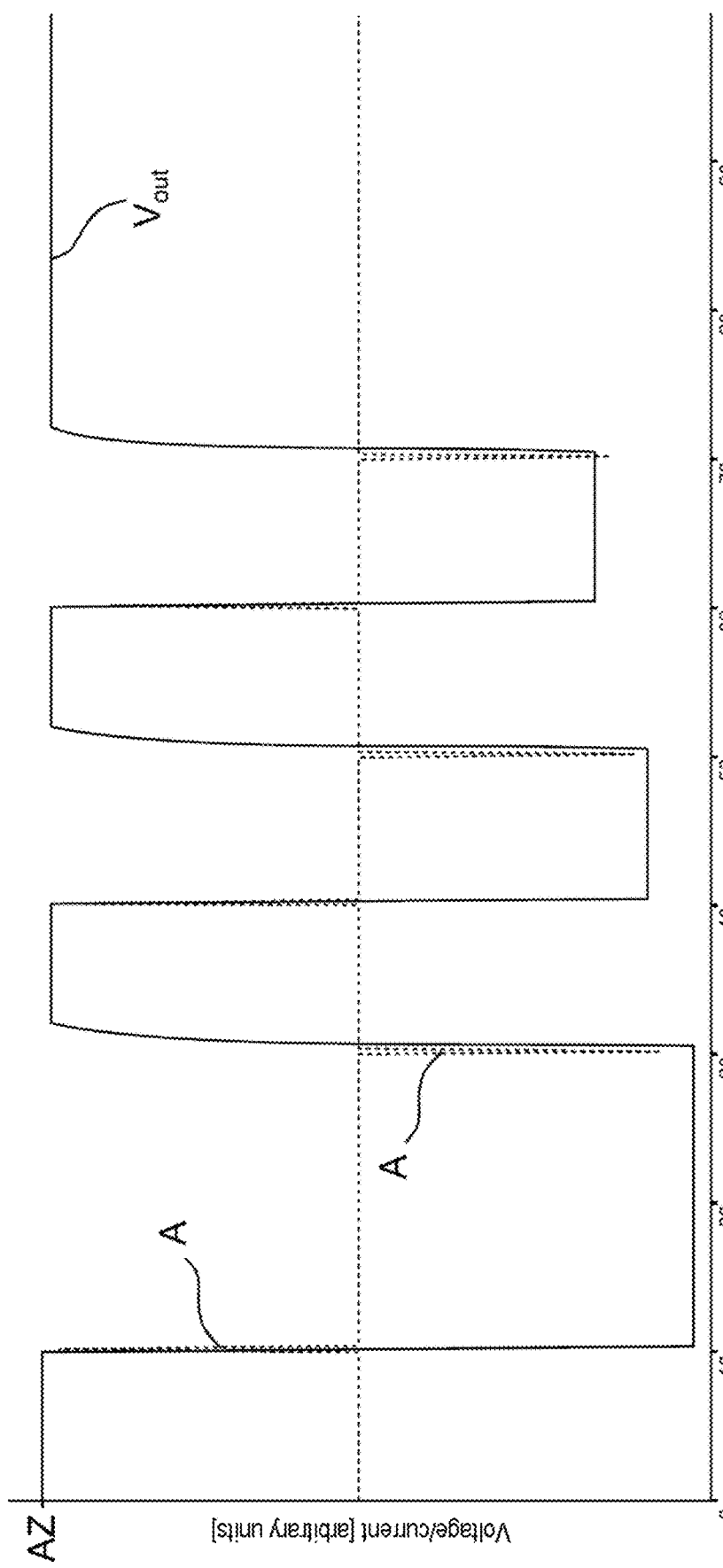
FIG. 4 shows a profile of a capacitor voltage of the circuit from FIG. 3.

FIG. 4 shows a temporal profile of a capacitor voltage $V_{out}$ of the circuit from FIG. 3. In the case of an actuation of the force sensor, a trigger pulse A is generated and the level decreases inversely proportionally to the force. In the case of a load relief of the force sensor, once again a trigger pulse A is generated and the level returns to the initial state AZ.

Figure 5:
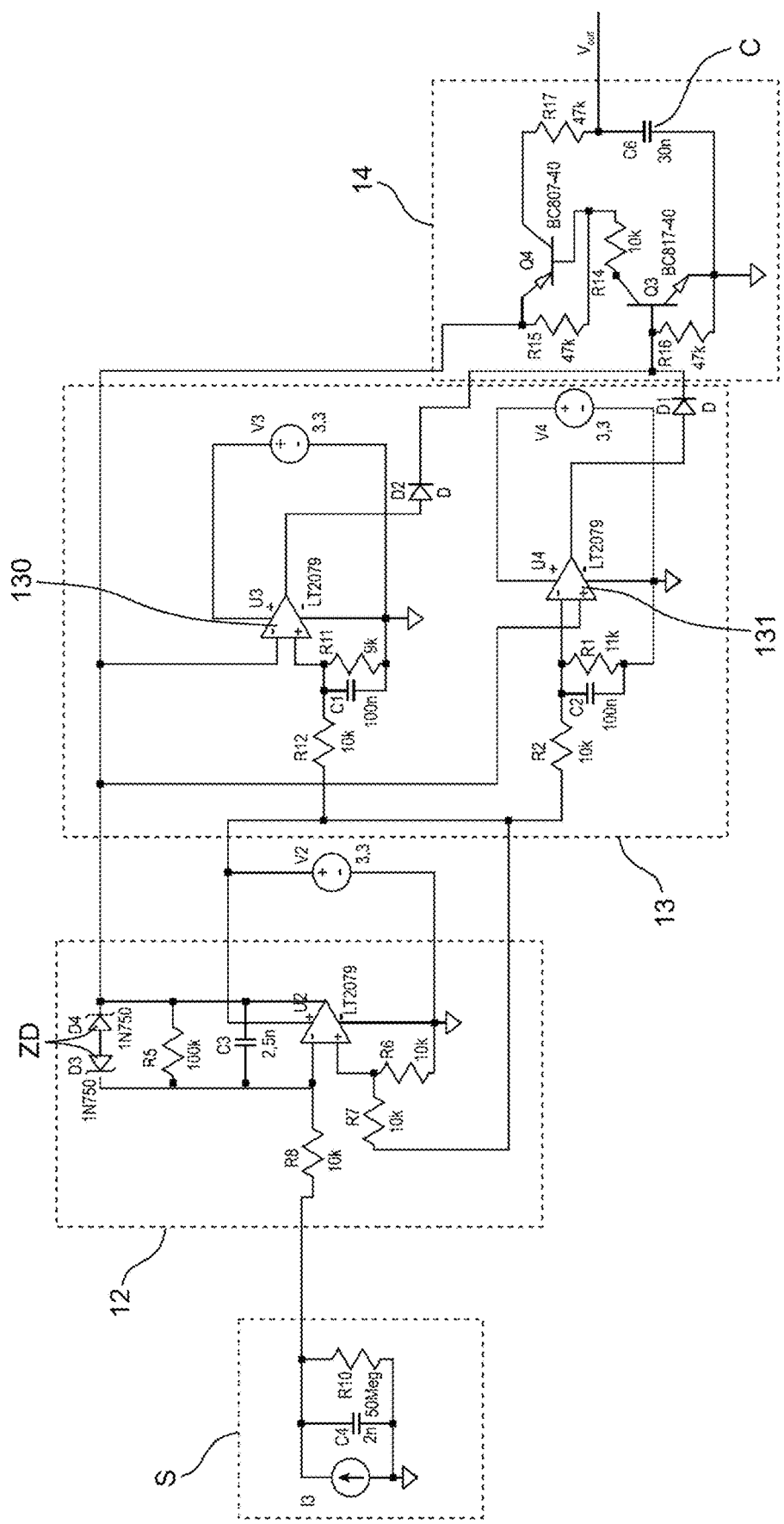
FIG. 5 shows a second circuit that implements a solution according to the disclosure.

FIG. 5 shows by way of example a second circuit that implements a solution according to the invention. In this embodiment, the integrator circuit is extended by a current mirror 14 and a comparator circuit 13 having two comparators 130, 131. The individual electronic components of the circuit will not be discussed at this juncture. They are designated in the figure and known to a person skilled in the art. In principle, the functioning corresponds to that of the circuit from FIG. 3, although the two comparators 130, 131 make it possible to store a positive and a negative pulse.

Figure 6:
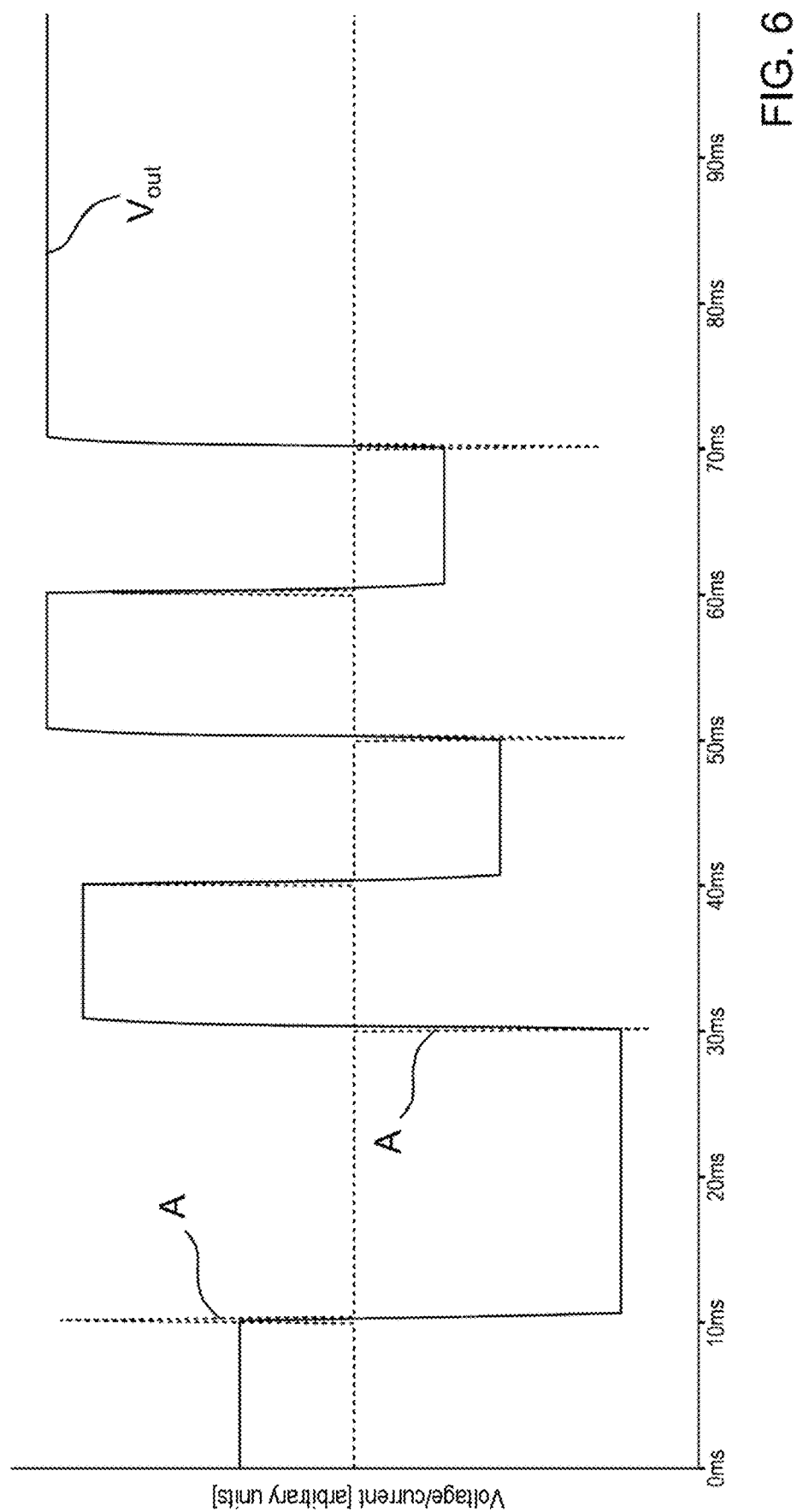
FIG. 6 shows a profile of a capacitor voltage of the circuit from FIG. 5.

FIG. 6 shows a temporal profile of a capacitor voltage $V_{out}$ of the circuit from FIG. 5. In the case of an actuation of the force sensor, a trigger pulse A is generated and results in a level that decreases inversely proportionally to the force. In the case of a load relief of the force sensor, by contrast, a trigger pulse A is generated and results in charge reversal of the capacitor and hence a rising level. Consequently, actuation and load relief each have a dedicated voltage value that is inversely proportional to the force action.

Figure 7:
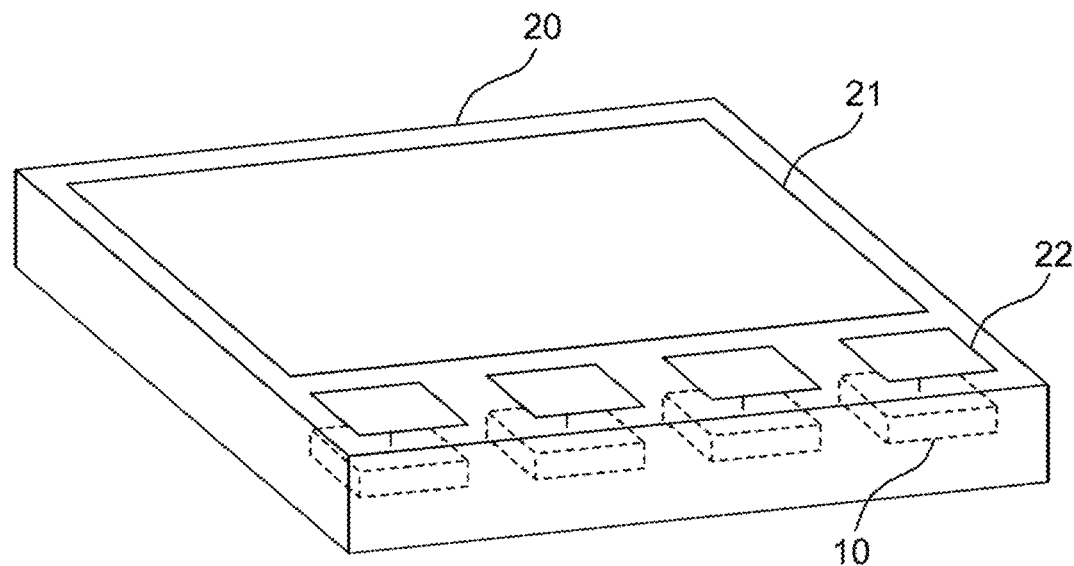
FIG. 7 schematically shows an input apparatus that uses a solution according to the disclosure.

FIG. 7 schematically shows an input apparatus 20 that uses a solution according to the disclosure. The input apparatus 20 comprises a display 21 for displaying information. The display 21 may be equipped with a touch function. In addition, the input apparatus 20 comprises a plurality of operating buttons 22, each comprising a piezoelectric sensor (not illustrated in FIG. 7) for detecting a user input. The signals of the operating buttons 22 are each evaluated by a device 10 according to the disclosure for measuring a force action.

Figure 8:
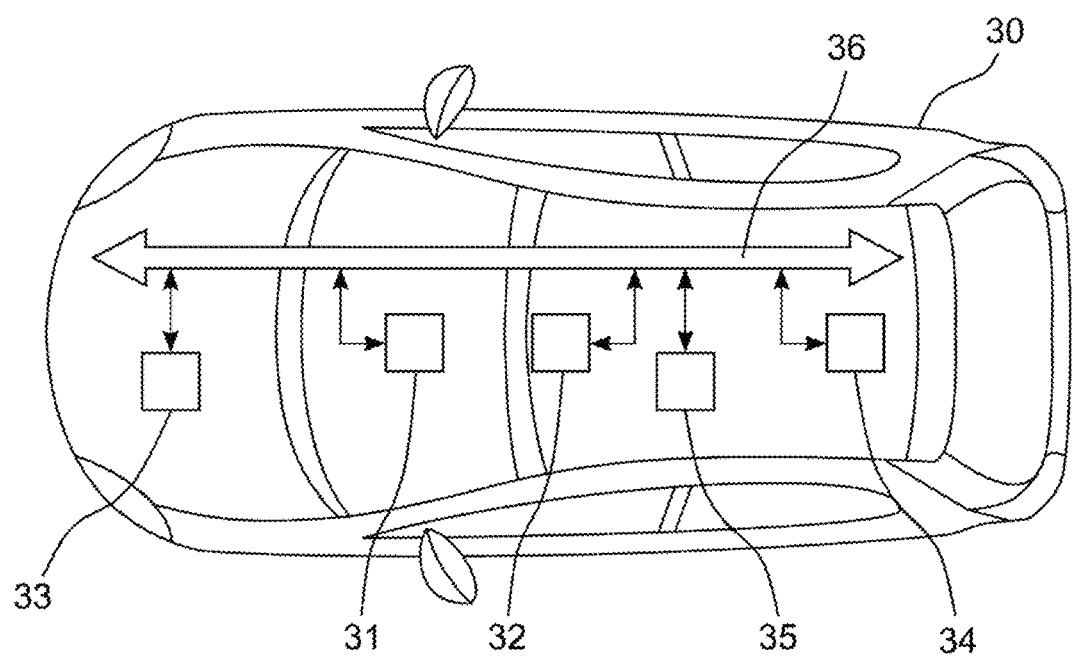
FIG. 8 schematically shows a machine with an input apparatus according to the disclosure.

FIG. 8 schematically shows a machine 30 in which a solution according to the disclosure is realized. The machine 30 is a motor vehicle in this example. The motor vehicle comprises an input apparatus according to the disclosure, which in this example is a touch-sensitive display device 31 arranged in a dashboard. The display device 31 may be for example a driver information display or a central display. A use as an interior display, a door display or a passenger display is likewise possible. Data concerning the vehicle surroundings may be acquired by a sensor system 32. The sensor system 32 may comprise in particular surroundings recognition sensors, for example ultrasonic sensors, laser scanners, radar sensors, lidar sensors, or cameras. The information acquired by the sensor system 32 may be used to generate content to be displayed for the display device 31. Further parts of the motor vehicle in this example are a navigation system 33, by which positional information may be provided, and also a data transfer unit 34. By way of example, a connection to a backend, for example for receiving updated software for components of the motor vehicle, may be established by the data transfer unit 34. A memory 35 is present for storing data. Data are exchanged between the various components of the motor vehicle via a network 36.

The invention claimed is:

1. A method for measuring a force action, the method comprising:
generating a voltage pulse resulting from a force action on a force sensor by a charge amplifier; and
storing a voltage value derived from the voltage pulse in a storage capacitor by a current mirror,
wherein storing the voltage value in the storage capacitor is triggered by a trigger pulse of a comparator circuit.

2. The method as claimed in claim 1, wherein the comparator circuit comprises two comparators, which make possible storing a positive and a negative voltage value derived from the voltage pulse.

3. The method as claimed in claim 1, wherein the force sensor is a piezoelectric sensor or an electrodynamic sensor.

4. A device for measuring a force action, the device comprising:
a charge amplifier for generating a voltage pulse resulting from a force action on a force sensor;
a current mirror for storing a voltage value derived from the voltage pulse in a storage capacitor; and
a comparator circuit for generating a trigger pulse that triggers storing the voltage value in the storage capacitor.

5. The device as claimed in claim 4, wherein the comparator circuit comprises two comparators, which make possible storing a positive and a negative voltage value derived from the voltage pulse.

6. The device as claimed in claim 4, wherein the force sensor is a piezoelectric sensor or an electrodynamic sensor.

7. An input apparatus, wherein the input apparatus comprises:
a device for measuring a force action, the device comprising:
a charge amplifier for generating a voltage pulse resulting from a force action on a force sensor;
a current mirror for storing a voltage value derived from the voltage pulse in a storage capacitor; and
a comparator circuit for generating a trigger pulse that triggers storing the voltage value in the storage capacitor.

8. The input apparatus as claimed in claim 7, wherein the input apparatus is a touch-sensitive display device.

* * * * *